(12) United States Patent
Gentzler

(10) Patent No.: US 6,211,733 B1
(45) Date of Patent: Apr. 3, 2001

(54) PREDISTORTION COMPENSATION FOR A POWER AMPLIFIER

(75) Inventor: Charles R. Gentzler, Thousand Oaks, CA (US)

(73) Assignee: Powerwave Technologies, Inc., Irvine, CA (US)

( * ) Notice: Subject to any disclaimer, the term of this patent is extended or adjusted under 35 U.S.C. 154(b) by 0 days.

(21) Appl. No.: 09/425,346

(22) Filed: Oct. 22, 1999

(51) Int. Cl.[7] ................... H03F 1/26; H03F 1/00; H04K 1/02

(52) U.S. Cl. ................ 330/149; 330/151; 375/297

(58) Field of Search ................... 330/149, 151; 375/296, 297

(56) References Cited

U.S. PATENT DOCUMENTS

| | | | |
|---|---|---|---|
| 4,639,938 | * | 1/1987 | Kennett ............... 330/149 |
| 5,598,127 | * | 1/1997 | Abbiati et al. ............ 330/149 |
| 5,742,201 | * | 4/1998 | Eisenberg et al. ........... 330/2 |
| 5,892,397 | * | 4/1999 | Belcher et al. ............ 330/149 |
| 6,008,698 | * | 12/1999 | Dacus et al. .............. 330/279 |

* cited by examiner

Primary Examiner—Robert Pascal
Assistant Examiner—Patricia Nguyen
(74) Attorney, Agent, or Firm—Fish & Richardson, P.C.

(57) ABSTRACT

The invention relates to an amplifier arrangement for amplifying an input using a distorting main power amplifier such as one operating as a class AB amplifier. The method and apparatus add to the input signal to the main amplifier a predistortion signal intended to compensate for the distortion added by the main power amplifier. In accordance with the invention, the input to the predistortion circuit is modified by measuring peak-to-peak signal values of the distortion in the output of the main power amplifier. The peak-to-peak values are measured in a signal derived by comparing an output derived from the main amplifier with an output derived from the input signal. A digitally controlled processor iteratively modifies various phase and gain controls to adjust the output of the amplifier.

8 Claims, 2 Drawing Sheets

PREDISTORTION COMPENSATION FOR A POWER AMPLIFIER

BACKGROUND OF THE INVENTION

The invention relates generally to power amplifiers, and in particular to linearizing the input/output transfer function for amplifiers, particularly high power class AB power amplifiers.

High power, broad band power amplifiers are well known. These amplifiers may operate in a feed forward configuration, or may have other forms of linearization which are required when the main power amplifier operates, for example, as a class AB amplifier. Although class A amplifiers usually produce less distortion than class AB amplifiers, class A amplifiers are also less efficient than class AB amplifiers. Thus, in order to retain the advantages of efficiency while minimizing distortion, class AB amplifier configurations have been developed which implement various forms of error or distortion correction.

One form of error correction attempts to distort the input signal in a manner which compensates for the distortions of a class AB amplifier. Thus, a predistortion circuit can be provided with various manual adjustments to produce a distortion signal from the original signal, so that when the distortion signal is combined with the input signal, and the combination is input to the power amplifier, operating for example, as a class AB amplifier, the output is substantially a linear amplification of the original input signal to the amplifier arrangement.

Such predistortion circuities typically employ a low power amplifier, preferably having the same general distortion characteristics as the main amplifier, so that its output, properly processed, can be used to obtain the necessary distortion components required to be combined with the input signal to the predistortion circuitry to generate a predistorted input to the main amplifier. Such configurations operate to substantially reduce the intermodulation frequency distortions produced by a class AB amplifier when the variable elements of the predistortion circuitry are properly adjusted.

However, even in properly adjusted amplifier arrangements using predistortion, a certain amount of instability, that is, drift in the operating point gain and/or phase, can be observed. Thus, a microprocessor can adjust the critical parameters of a predistortion circuit to minimize the distortion components, but has the limitation that as the predistortion circuit is adjusted, it unbalances the cancellation loop in the feed-forward configuration. This requires the microprocessor to re-null the signal cancellation loop before a decision can be made as to whether an improvement has actually been achieved. This is a very time consuming process, and if the input signals are of a type which are in a constant state of change, for example, turned on and off, the loops will become "confused" and not yield an adaptive improvement. Thus, the prior art adaptive predistortion techniques such as that disclosed in U.S. application Ser. No. 09/057,332, filed Apr. 8, 1998, and entitled, DYNAMIC PREDISTORTION COMPENSATION FOR A POWER AMPLIFIER, the contents of which are incorporated herein, in their entirety, by reference, works well for steady state signals but fails to give the results sought if operated in a transient environment. That transient environment exists for certain types of multi-channel operation, with the analog cellular system being a good example. In that system, carriers are continually being switched on and off.

SUMMARY OF THE INVENTION

The invention relates to an amplifier arrangement for amplifying an input signal with which a distortion cancelling input is combined. The amplifier arrangement features a main amplifier, a predistortion circuitry having an output connected to the main amplifier, and a feedback loop. The feedback loop features a comparator which differences a delayed derivative of the input signal to the amplifier arrangement with a signal representative of the output of the main amplifier to provide an error signal, an energy detector for receiving the error signal and generating a detected energy error signal output, a peak-to-peak detector for receiving the error signal and generating a peak-to-peak error signal output, a controller responsive to the detected energy signal output and the peak-to-peak error signal output for generating correction signals, the predistortion circuit being responsive to at least a portion of the correction signals for modifying its output to the main amplifier, and a control circuitry for receiving the input signal and delivering it to the predistortion circuitry, the control circuitry being responsive to at least a peak-to-peak value of the error signal for reducing the peak-to-peak signal value of the error signal.

In specific embodiments, the main amplifier is a broad band RF amplifier operating in a Class AB mode, and the feedback loop controller is responsive to the energy measurements for iteratively adjusting the signal correction circuitry amplitude and phase.

In another aspect, the invention relates to a method for correcting distortion in an amplified signal output from a main amplifier of an amplifier arrangement, the main amplifier being part of an amplifier arrangement and the arrangement having an input and an output. The method combines predistortion signals with the input to the amplifier arrangement for delivery to the main amplifier. The method features generating the predistortion signals in a predistortion circuit derived from an input to the amplifier arrangement, generating an error signal from an error signal derived from the output of the main amplifier representing distortion energy, generating a peak-to-peak error signal from the error signal representing peak-to-peak signal values, and iteratively and successively correcting, using a digitally controlled processor responsive to at least the energy error signal and a peak-to-peak error signal, gain and phase adjustments in and prior to the predistortion circuitry.

The method in a particular embodiment features comparing a signal derived from the output of the main amplifier and a signal derived from the input to the amplifier arrangement for generating a difference signal, and measuring peak-to-peak levels of a signal derived from the different signal for generating the peak-to-peak error signal.

The invention thus advantageously quickly predistorts, in a dynamic manner, the input signal to a class AB or other distorting main amplifier and thereby causes a substantial linearization of the input-output characteristics of the entire amplifier arrangement in a short period of time.

BRIEF DESCRIPTION OF THE DRAWINGS

Other objects, features, and advantages of the invention will be apparent from the following description; taken together with the drawings in which.

DESCRIPTION OF THE PREFERRED EMBODIMENTS

Figure 1:
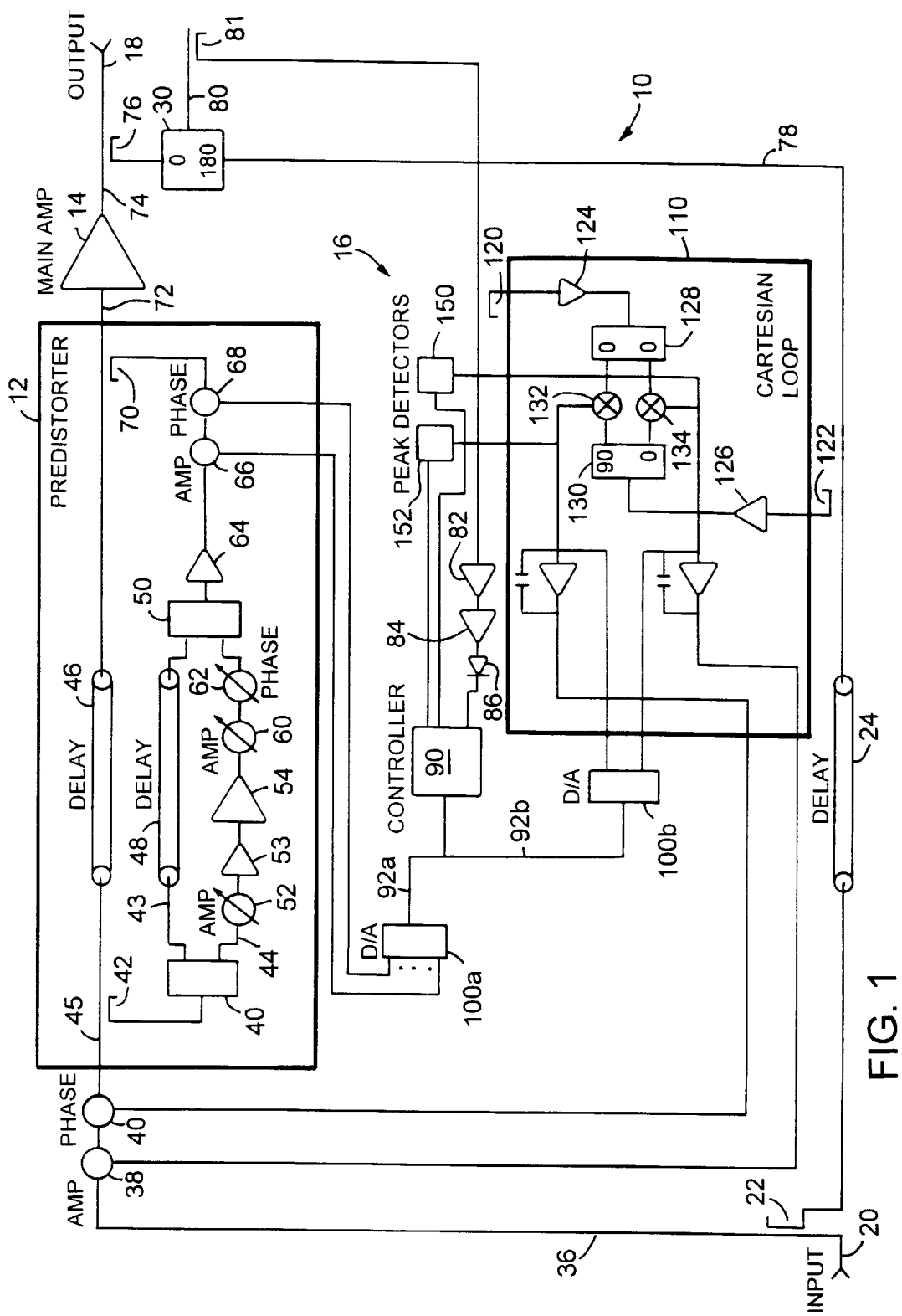
FIG. 1 is a schematic block diagram of a preferred embodiment of the predistortor amplifier and control circuitry in accordance with the invention.

Referring to FIG. 1, an amplifier arrangement 10 has a predistortion circuitry 12 ,a main power amplifier 14, and a control circuitry 16. Amplifier 14 is typically a high power class AB amplifier whose output over a line 18 can be either used directly, or can be the input to a feed forward distortion cancellation circuitry such as that described in my U.S. Pat. No. 5,796,304, entitled BROADBAND AMPLIFIER WITH QUADRATURE PILOT SIGNAL, the contents of which are incorporated herein by reference.

The input to the amplifier arrangement, over a line 20, is split (or sampled) for a number of purposes. First, a line sampling coupler 22 directs part of the input signal to a delay element 24. The output of the delay element is directed to a comparison device 30.

The remaining input signal over line 36 is received by a controlled gain circuitry 38 and then a controlled phase circuitry 40, and the output of circuitry 40 is sampled by another coupler 42. The output of coupler 42 is received by a signal splitter 40 which divides the signal equally for output over lines 43 and 44. The remaining input signal from line 45 is directed to a delay element 46 of predistortor 12.

The output of splitter 40 over line 43 is directed to a delay element 48, the output of which is received by comparison circuitry 50. The other output of splitter 40 over line 44 is received by a gain controlled amplifier 52, the output of which is directed to auxiliary amplifiers 53, 54. The output of amplifier 54 is received by a controlled gain circuitry 60. The output of controlled gain circuitry 60 is delivered to a controlled phase circuitry 62 the output of which is compared with the signal from delay element 48 in comparison circuitry 50. The difference between the two signals, representing distortion components introduced primarily by amplifier 54, is passed through a linear amplifier 64 to a controlled gain circuit 66. The output of the control gain circuit 66 is received by a controlled phase circuit 68. The output of the controlled phase circuit 68 is delivered to a coupler 70 which combines the output of the phase circuit 68 with the output of the delay element 46, to generate an input, over a line 72, to the main power amplifier 14.

The output of the main power amplifier 14, over a line 74, is sampled by a coupler 76 and the sampled output signal is compared (differenced) to the output of the delay 24 available over a line 78, to generate a distortion error signal on a line 80. The distortion error signal over line 80 is sampled by coupler 81, and is amplified using amplifiers 82 and 84, connected in series with each other, and the output of amplifier 84 is detected, here using a Schottky diode 86 to measure the energy in the signal, for input to a digital controller 90. The digital controller 90 outputs digital signals over lines 92a and 92b to control digital to analog (D/A) converters 100a and 100b respectively. The analog outputs of the digital to analog converters are directed to control various gain and phase elements of the predistortor circuitry 12 and a Cartesian loop circuit 110.

In order to operate the adaptive predistortion circuitry in a transient environment, the invention provides for speeding up the effective response time of the control process of the control loop so that tuning of the predistortion circuit can be quickly evaluated. This allows the adaptive predistortion circuit to be effective in the transitory environment.

There is known in this field to use a Cartesian loop for controlling gain and phase elements, of the various circuitries. The Cartesian loop senses both amplitude and phase, and can operate quite quickly. The Cartesian loop couples over a coupler 120 to the distortion error signal over line 80, and over a coupler 122 to the delayed input signal provided by delay 24. Both signals are amplified using amplifiers 124 and 126 respectively, and are respectively split using a splitter 128 and a quadrature splitter 130, the output being applied to mixing elements 132 and 134. The output of the mixing elements are respectively directed to control amplitude and phase adjustments of controlled circuitries 38 and 40 and are also passed to peak detectors 150, 152.

This system operates quite fast, so that for signals spaced within about 100 kilohertz, the loop performs cancellation of the distortion products coupled from line 120. The limitation in the circuit is the time delay of the system, since the circuit uses a feed back technology. The signals which are left at the cancellation point, over line 80, are the high frequency distortion components. Ultimately, these are fed to the error amplifier when a feed forward system is used as described in U.S. Pat. No. 5,796,304.

In a Cartesian loop such as that illustrated in FIG. 1, the absolute carrier null is a function of the balance of the phase detector elements. This is true whether the phase detector elements are diode mixers, or active mixers. A conventional detector can be used to allow the microprocessor or controller 90 to tune for the lowest possible power level at the cancellation point, line 80. This process can be accomplished at a very low speed since any drift will be due to temperature and aging as described in co-pending patent application Ser. No. 09/057,332. Power can be detected, as described in that previous application, using a Schottky diode arrangement such as elements 82, 84, and 86, illustrated in FIG. 1. In practical circuits, nulls of 25dB can be obtained without offset correction and it is expected that this value can be increased to 30–40dB depending upon the spacing between tones (amplitude and phase linearity) of the main amplifier 14.

In accordance with the present invention, however, it is the high frequency components which are left on line 80 which are further removed, using the microprocessor/controller 90 to adjust the predistortion circuitry to minimize the level of these distortion components. The distortion and remaining main signals over line 80 are in the form of an RF envelope which represents the instantaneous error signal from the main amplifier. The apparatus of the invention detects this error envelope and adjusts the predistortion circuitry for a minimum level, which is the optimum tuning point for the predistortion circuitry.

To implement this aspect of the system peak detectors 150, 152, operating at high speed, measure the value of the distortion signal peaks and provide that information to the controller 90. The lower the peak-to-peak voltage, the lower is the distortion in the main amplifier. The lower frequency components, which could confuse the distortion detector, are eliminated by the very fast response time of the loop. That portion of the detected envelope which can not be detected, would be in the RF form and, in a feed-forward amplifier system, would be sent to the error amplifier for RF cancellation. Thus, in accordance with the invention, a peak-to-peak detector is used to detect distortion power in addition to (or instead of in some systems) the Schottky diode 86 which is more of an RMS device. This system is, of course, applicable to both feed forward and conventional predistortion only single channel amplifiers.

In operation, the microprocessor 90 can first detect the energy (corresponding to RMS power) in the output of comparison circuitry 30 over line 80 as sampled by coupler 81 and can act to minimize that value by controlling, through digital to analog converters 100a, 100b, the amplitude and phase of elements 38, 40 and 66, 68. This is done in an iterative process as illustrated in the flow diagram of FIG. 2, first adjusting elements 66, 68 and thereafter adjusting elements 38, 40. Note that the other gain and phase controlled elements 52, 60, and 62 can also be controlled by the microprocessor if desired or set manually.

Figure 2:
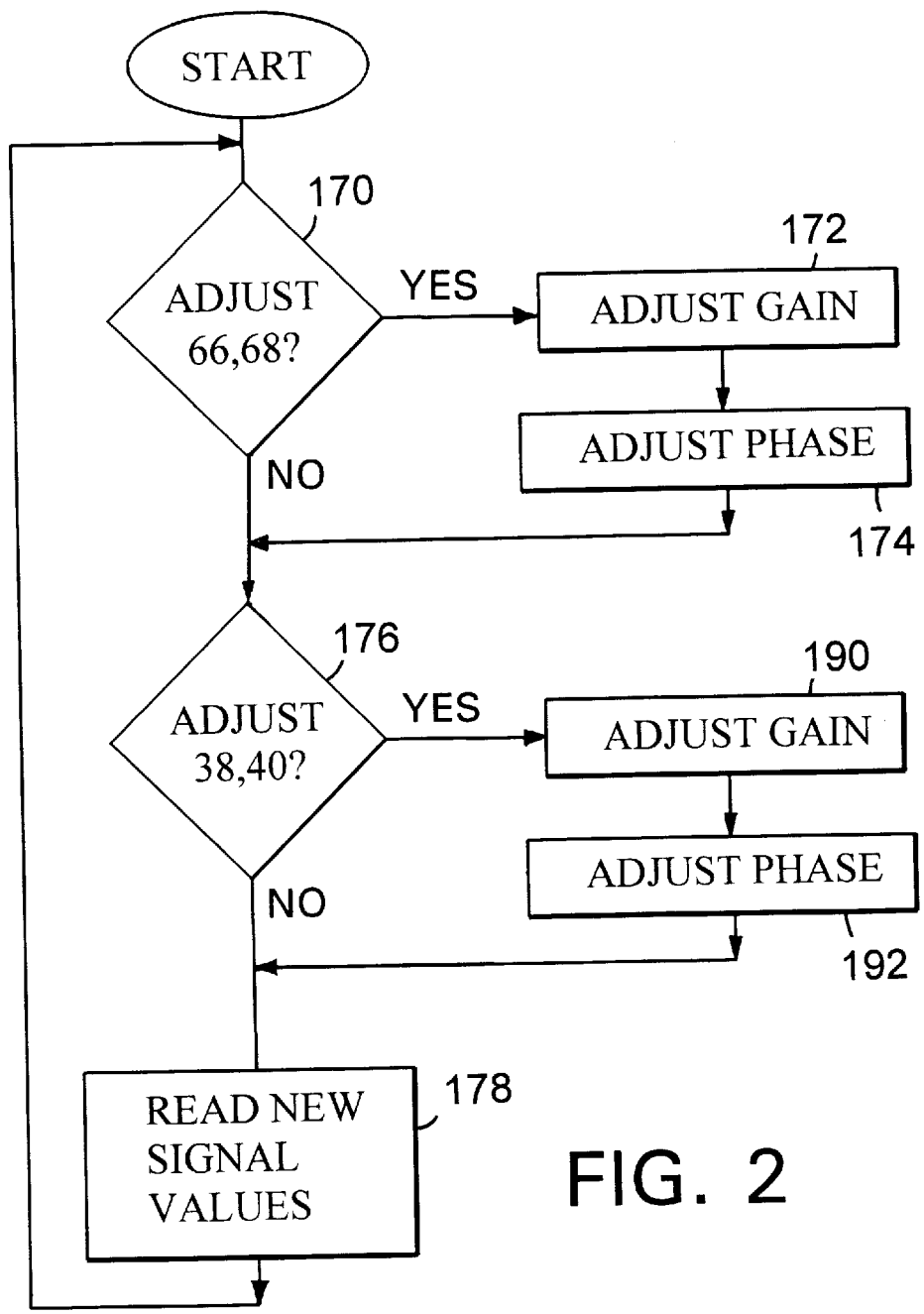
FIG. 2 is a flow chart illustrating operation of the digitally controlled processor in accordance with a preferred embodiment of the invention.

In the preferred embodiment of the invention, referring to FIG. 2, the controller first checks to determine whether amplitude and phase elements 66 and 68 should be adjusted. If they are to be adjusted, as indicated at decision point 170, the gain and phase are adjusted at 172 and 174. The elements controlled by the Cartesian loop, that is gain element 38 and phase element 40, are considered next for adjustment at 176. If elements 38, 40 are to be adjusted, then the gain is adjusted at 190 and the phase is adjusted at 192. For each iteration of the control loop in FIG. 2, new values for the distortion signals are read at 178. Once the predistortor has been adjusted, then further adjustments within the predistortor are not made and the signals over line 80 contain primarily the high frequency distortions. These are then peak-to-peak detected using the peak detectors 150, 152 and in response to the signal values provided by those detectors, the controller 90 makes a decision whether to further adjust gain element 38 and phase element 40 at decision 176. In this manner, the peak to peak value of the high frequency components is reduced to a minimum.

Thus the controller 90, operating substantially in a feed back loop environment, iteratively adjust the varying control elements to which it is connected and determines whether adjustment improves, has no effect, or renders worse, the error products such as the output of the first loop over line 80. The object is to minimize the distortion at the output of the linear amplifier 14 upon reaching a null. A typical control processor is the Motorola model MC68HC11E9 which allows for a correction sequence approximately every 50 milliseconds.

In this manner, the Cartesian loop operates at a speed great enough that it does not cause the predistortor settings to be changed in order to determine whether, in a transient environment, the settings still represent a proper null.

Additions, subtractions, and other modifications of the described and preferred embodiment of the invention will be apparent to those practiced in this field and are within the scope of the following claims.

What is claimed is:

1. An amplifier arrangement for amplifying an input signal with which a distortion cancelling input is combined, said amplifier arrangement comprising:

a main amplifier, a predistortion circuitry having an output connected to the main amplifier, and a feedback loop including a comparator which differences a delayed derivative of said input signal to said amplifier arrangement with a signal representative of the output of said main amplifier to provide an error signal;

an energy detector for receiving said error signal and generating a detected energy error signal output;

a peak-to-peak detector for receiving said error signal and generating a peak-to-peak error signal output, a controller responsive to the detected energy signal output and the peak-to-peak error signal output for generating correction signals, said predistortion circuitry being responsive to at least a portion of said correction signals for modifying its output to the main amplifier, and a control circuitry, for receiving the input signal and delivering it to the predistortion circuitry, said control circuitry being responsive to at least a peak-to-peak value portion of the output of the error signal for reducing the peak-to-peak signal value of said error signal.

2. The amplifier arrangement of claim 1 wherein said main amplifier is a broadband radio frequency amplifier operating in a Class AB mode.

3. The amplifier arrangement of claim 1 further wherein said control circuitry comprises a phase and a gain correction circuitry in said feedback loop for adjusting said input signal to said predistortion circuitry.

4. The amplifier arrangement of claim 3 further wherein said detector comprises an energy measurement circuit for measuring the energy in said error signal, and said feedback loop controller is responsive to the energy measurement circuit, for iteratively adjusting the signal correction circuitry amplitude and phase.

5. The amplifier arrangement of claim 4 wherein said phase and gain correction circuits provide phase and gain correction at said predistortion circuitry.

6. A method of correcting distortion in an amplified signal output from a main amplifier of an amplifier arrangement, said main amplifier being part of the amplifier arrangement and the arrangement having an input and an output, said method combining predistortion signals with the input to said amplifier arrangement for delivery to said main amplifier, comprising:

generating said predistortion signals in a predistortion circuit, derived from an input to said amplifier arrangement, generating an energy error signal from an error signal derived from the output of the main amplifier representing distortion error energy, generating a peak-to-peak error signal from the error signal representing peak-to-peak signal values, and iteratively and successively correcting, using a digitally controlled processor responsive at least to said energy error signal and the peak-to-peak error signal, phase and gain adjustments in and prior to said predistortion circuit.

7. The method of claim 6 wherein said interactively correcting step is responsive to distortion error signals from said main amplifier.

8. The method of claim 7 further comprising comparing a signal derived from the output of the main amplifier and a signal derived from the input signal to the amplifier arrangement for generating a difference signal, and measuring peak-to-peak levels of a signal derived from said difference signal for generating said peak-to-peak error signal.

* * * * *